(12) United States Patent
Rock

(10) Patent No.: US 8,367,307 B2
(45) Date of Patent: Feb. 5, 2013

(54) SOLUTION TO OPTICAL CONSTRAINT ON MICROTRUSS PROCESSING

(75) Inventor: Jeffrey A. Rock, Fairport, NY (US)

(73) Assignee: GM Global Technology Operations LLC, Detroit, MI (US)

(*) Notice: Subject to any disclaimer, the term of this patent is extended or adjusted under 35 U.S.C. 154(b) by 400 days.

(21) Appl. No.: 12/700,800

(22) Filed: Feb. 5, 2010

(65) Prior Publication Data

US 2011/0195361 A1  Aug. 11, 2011

(51) Int. Cl.
*G03F 7/20* (2006.01)

(52) U.S. Cl. .......................................... 430/322

(58) Field of Classification Search ............... 430/5, 322
See application file for complete search history.

(56) References Cited

U.S. PATENT DOCUMENTS

| | | | |
|---|---|---|---|
| 7,099,057 B2 * | 8/2006 | Parker et al. ..................... | 359/15 |
| 2010/0167217 A1 * | 7/2010 | Ando ........................... | 430/326 |

FOREIGN PATENT DOCUMENTS

| | | | |
|---|---|---|---|
| CN | 1570771 A | | 1/2005 |
| JP | 07-220990 | * | 8/1995 |
| WO | WO 2005/017623 | * | 2/2005 |

OTHER PUBLICATIONS

English translation of JP Publication 07-220990, Aug. 1995.*
English translation of WO 2005/017623, Feb. 2005.*
ACTA Materialia 55 (2007 6724-6733); Science Direct; Compression behavior of micro-scale truss structures formed from self-propagating polymer waveguides; Alan J. Jacobsen, William Barvosa-Carter, Steven Nutt; www.sciencedirect.com.
ACTA Materialia xxx (2008); Science Direct; Shear behavior of polymer micro-scale truss structures formed from self-propagating polymer waveguides; Alan J. Jacobsen, William Barvosa-Carter, Steven Nutt; www.sciencedirect.com.
Transactions of the ASME; Layered Manufacturing: Current Status and Future Trends; Vol. Mar. 1, 2001, Copyright 2001; Dutta, Prinz, Rosen, Weiss.
Advanced Materials 2007; Micro-scale Truss Structures formed from Self-Propagating Photopolymer Waveguides; Alan J. Jacobsen, William Barvosa-Carter, Steven Nutt; Wiley InterScience.
Elsevier Editorial System(tm) for Acta Materialia (Manuscript Draft No. A-07-1792R2); Micro-scale truss structures with three-fold and six-fold symmetry formed from self-propagating polymer waveguides; Alan J. Jacobsen, William Barvosa-Carter, Steven Nutt.
"Fresnel lens"; From Wikipedia, the free encyclopedia; http://en.wikipedia.org/wiki/Fresnel_lens.

(Continued)

*Primary Examiner* — Brittany Raymond
(74) *Attorney, Agent, or Firm* — Fraser Clemens Martin & Miller LLC; J. Douglas Miller

(57) ABSTRACT

A system for fabricating a radiation-cured structure is provided. The system includes a radiation-sensitive material having a first refractive index; a mask formed from a mask material having a second refractive index; and a radiation source. The mask is disposed between the radiation source and the radiation-sensitive material, and has a plurality of substantially radiation transparent apertures. The radiation source is configured to generate radiation beams for at least one of initiating, polymerizing, and crosslinking the radiation-sensitive material. The system includes at least one of a) an at least one normalizing surface disposed between the radiation source and the mask, b) a refractive fluid having a third refractive index disposed between the radiation source and the mask, and c) the refractive fluid having the third refractive index disposed between the mask and the radiation-sensitive material. A method for fabricating the radiation-cured structure is also provided.

6 Claims, 5 Drawing Sheets

OTHER PUBLICATIONS

"Total internal reflection"; From Wikipedia, the free encyclopedia; http://en.wikipedia.org/wiki/Total_internal_reflection.

"Dispersive prism"; From Wikipedia, the free encyclopedia; http://en.wikipedia.org/wiki/Triangular_prism_(optics).

Reflexite Display Optics, Microprism Technology for Luminaries; Management of Light; www.display-optics.com.display.optics@refexite.com.

Kaist micro MST; Researches, What is LIGA.

Snell's law; From Wikipedia, the free encyclopedia; http://en.wikipedia.org/wiki/Snells_law.

List of refractive indices; From Wikipedia, the free encyclopedia; http://en.wikipedia.org/wiki/List_of_refractive_indices.

Refraction Index of Various Substances for 3D modelers; http://robinwood.com/Catalog/Technical/Gen3DTuts/Gen3DPages/RefractionIndexList.html.

* cited by examiner

SOLUTION TO OPTICAL CONSTRAINT ON MICROTRUSS PROCESSING

FIELD OF THE INVENTION

The present disclosure relates to a fabrication of radiation-cured structures and, more particularly, to a method for fabricating a radiation-cured microtruss.

BACKGROUND OF THE INVENTION

Microtruss structures formed by photopolymerization have been described by Jacobsen et al. in "Compression behavior of micro-scale truss structures formed from self-propagating truss elements", Acta Materialia 55, (2007) 6724-6733, the entire disclosure of which is hereby incorporated herein by reference. One method and system of creating polymer materials with ordered microtruss structures is disclosed by Jacobsen in U.S. Pat. No. 7,382,959, the entire disclosure of which is hereby incorporated herein by reference. Microtruss materials produced by the method and system are further disclosed by Jacobsen in U.S. patent application Ser. No. 11/801,908, the entire disclosure of which is hereby incorporated herein by reference. A polymer material that is exposed to radiation and results in a self-focusing or self-trapping of light by formation of truss elements is also described by Kewitsch et al. in U.S. Pat. No. 6,274,288, the entire disclosure of which is hereby incorporated herein by reference.

As shown in FIG. 1, the known systems for fabricating microtruss structures may include at least one collimated light source 100 selected to produce a collimated light beam 102; a reservoir 104 having a photomonomer 106 adapted to be polymerized by the collimated light beam 102; and a mask 108 having at least one aperture 110 and positioned between the at least one collimated light source 100 and the reservoir 104. The collimated light source 100 is generally a mercury arc lamp configured to produce collimated ultraviolet (UV) light beams at a desired angle. The mask it typically formed on a layer of quartz glass 112. A light boundary 114 exists between the quartz glass 112 and the air, and the quartz glass 112 and the photomonomer 106, due to the differences in index of refraction between the respective media. The at least one aperture 110 is adapted to guide a portion of the collimated light beam 102 into the photomonomer 106 to form the at least one truss element 116 through a portion of a volume of the photomonomer 106. Multiple truss elements can be formed simultaneously from a single collimated light beam 102 that travels along a path from the light source 100, through the mask 108 and the quartz glass 112, and into the reservoir 104 of the photomonomer 106.

The formation of microtruss structures from the known methods, however, has been constrained by an optical phenomenon known as Snell's Law. Snell's Law states that the ratio of the sines of the angles of incidence and refraction is equivalent to the opposite ratio of the indices of refraction. For example, Snell's Law can be represented as $$n_1 \sin \theta_1 = n_2 \sin \theta_2$$

where $n_1$ and $n_2$ denote the first and second media and the angles of incidence and refraction are measured with respect to the normal to the interface between the media. A similar application of Snell's Law to a third and fourth media can be represented as $$n_1 \sin \theta_1 = n_2 \sin \theta_2 = n_3 \sin \theta_3 = n_4 \sin \theta_4$$

For a given set of indices where $n_2 > n_1$, there is limiting angle $\theta_2$ corresponding to the physical limit for the incoming angle $\theta_1$ of 90 degrees (parallel to the interface.) For the case of light passing from air into a quartz glass mask substrate, the indices of 1.0003 and 1.46 respectively, the limiting angle in the glass substrate is 43 degrees as determined by solving for $\theta_2$ in the equation $n_1 \sin \theta_1 = n_2 \sin \theta_2$.

Under Snell's Law, the refracted angle ($\theta$) is greater than the angle of incidence ($\alpha$), and the truss elements 116 having desirably large refracted angles ($\theta$) cannot be produced through conventional means where the boundary 114 between the air and the quartz glass 112 exists.

With renewed reference to FIG. 1, a practical example with an incident angle ($\alpha$) of about 68 degrees is shown. The refracted angle ($\theta$) in the quartz glass 112 is about 40 degrees, or only 3 degrees less than the theoretical limit of 43°. Since the faces of the quartz glass 112 are parallel in FIG. 1, the incident angle ($\alpha$) as the collimated light beam 102 exits the quartz glass 112 is also about 40 degrees. As the collimated light beam 102 proceeds into the photomonomer 106 with an index of about 1.51, the resulting refracted angle ($\theta$) is about 38 degrees There is a continuing need for a system and method for fabricating radiation-cured structures with truss elements disposed at angles greater than about 45°, and in particular at angles of greater than about 60°, with respect to normal to the refractive boundary surface. Desirably, the system and method enables production of large-angled radiation-cured structure features, including microtruss structures.

SUMMARY OF THE INVENTION

In concordance with the instant disclosure, a system and method for fabricating radiation-cured structures with truss elements disposed at angles greater than about 45°, and in particular at angles of greater than about 60°, with respect to normal to the refractive boundary surface, which enables production of large-angled radiation-cured structure features, including microtruss structures, is surprisingly discovered.

In a first embodiment, a system for fabricating a radiation-cured structure includes a radiation-sensitive material having a first refractive index, a mask formed from a mask material having a second refractive index, and a radiation source. The mask is disposed between the radiation-sensitive material and the radiation source. The mask has a plurality of substantially radiation transparent apertures formed therein. The radiation source is configured to generate radiation beams for at least one of initiating, polymerizing, crosslinking, and dissociating the radiation-sensitive material. The system includes at least one of a) an at least one normalizing surface disposed between the radiation source and the mask, b) a refractive fluid having a third refractive index disposed between the radiation source and the mask, and c), the refractive fluid having the third refractive index disposed between the mask and the radiation-sensitive material.

In another embodiment, the system includes the radiation-sensitive material having the first refractive index, the radiation source, and the mask having the second refractive index. The refractive fluid having the third refractive index is disposed between the mask and the radiation-sensitive material. A prism having at least one normalizing surface is also disposed between the radiation source and the mask.

In a further embodiment, a method for fabricating a radiation-cured structure, includes the steps of: providing a radiation-sensitive material having a first refractive index, a mask having a plurality of substantially radiation transparent apertures formed therein, the mask formed from a mask material having a second refractive index, and a radiation source configured to generate radiation beams for at least one of initiating, polymerizing, crosslinking, and dissociating the radiation-sensitive material; placing the mask between the radiation-sensitive material and the radiation source; at least one of a) disposing an at least one normalizing surface between the radiation source and the mask, b) disposing a refractive fluid having a third refractive index between the radiation source and the mask, and c) disposing the refractive fluid having the third refractive index between the mask and the radiation-sensitive material; and exposing the radiation-sensitive materials to a plurality of radiation beams through the radiation transparent apertures in the mask. The radiation-cured structure is thereby formed.

DRAWINGS

The above, as well as other advantages of the present disclosure, will become readily apparent to those skilled in the art from the following detailed description, particularly when considered in the light of the drawings described herein.

DETAILED DESCRIPTION OF THE INVENTION

Figure 1:
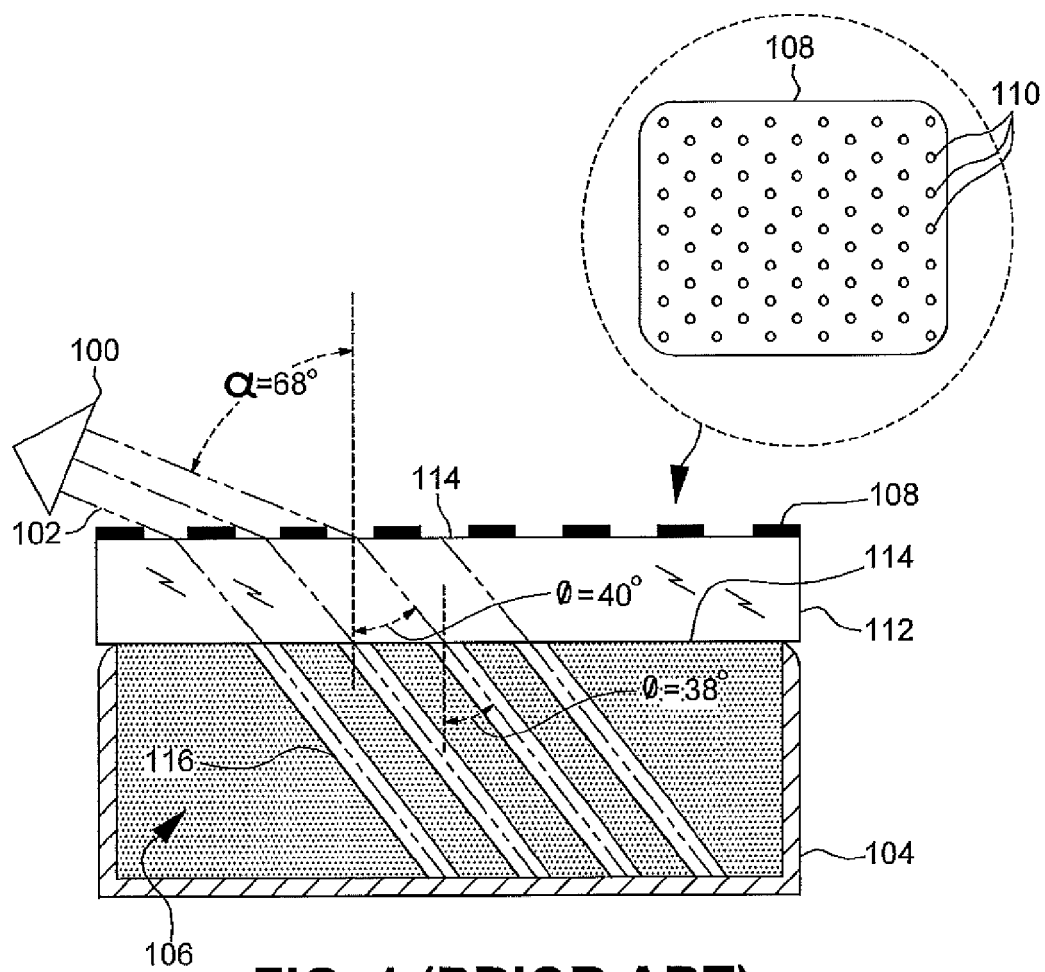
FIG. 1 is a schematic side sectional view and top plan illustration showing a prior art system for forming radiation-cured structures.

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, are not necessary or critical.

As shown in FIGS. 2-9, the present disclosure includes a system 200 for fabricating a radiation-cured structure 201, such as a microtruss structure having a plurality of elements 202, for example. Exemplary architectures of the microtruss structure are described by Jacobsen in U.S. Pat. No. 7,382,959 and U.S. patent application Ser. No. 11/801,908. Although the system 200 may be described herein with respect to the formation of microtruss structures, one of ordinary skill in the art should appreciate that other radiation-cured structures 201 may also be fabricated within the scope of the present disclosure.

The system 200 includes a radiation-sensitive material 203 having a first refractive index, a mask 204 formed from a mask material 206 having a second refractive index, and a radiation source 208 configured to generate a plurality of radiation beams 210 for at least one of initiating, polymerizing, crosslinking, and dissociating the radiation-sensitive material 203. The radiation-cured structure 201 of the present disclosure may be formed from the radiation sensitive material 203 as described, for example, in Assignee's co-pending U.S. patent application Ser. No. 12/339,308, the entire disclosure of which is hereby incorporated herein by reference. The mask 204 is disposed adjacent the radiation-sensitive material 203 and has a plurality of substantially radiation transparent apertures 212 formed therein. The radiation source 208 is disposed adjacent the mask 204 opposite the radiation-sensitive material 203.

At least one refractive boundary 211 may exist in the system 200. The refractive boundary 211 is defined herein as any interface between two media in the system 200 having different indices of refraction. For example, the system 200 may have the refractive boundary 211 at the interface of the mask 204 with the radiation-sensitive material 203, at the interface of a prism 226 (shown in FIGS. 2, 6, 7, and 9) with air, at the interface of the prism 226 with the mask 204, and at the interface of the mask 204 with the radiation source 208, where the radiation source 208 abuts the mask 204 (not shown). It should be understood that the radiation beams 210 may bend as they cross the refractive boundaries 211 of the system 200 in a phenomenon known as refraction.

Illustratively, the radiation beams 210 may approach the refractive boundary 211 at an angle of incidence ($\alpha$) relative to normal to a plane formed by the refractive boundary 211. The radiation beams 210, upon crossing the refractive boundary 211, are bent according to Snell's Law, as described hereinabove, and have a refracted angle ($\theta$) relative to normal to the plane formed by the refractive boundary 211. When the index of refraction of the first medium is less than the index for the second medium, the refracted angle ($\theta$) is less than the angle of incidence ($\alpha$) and ultimately defines the angle of the radiation-cured elements 202 and the geometry of the resulting radiation-cured structure 201 after the net result of bending at each refractive boundary 211.

The radiation-sensitive material 203 may be supported by a processing substrate 214, for example. The processing substrate 214 may be disposed atop a stationary base plate 216 during the fabrication process. The substrate 214 may further be provided with a coating or surface treatment (not shown) for bonding and debonding from the radiation-cured structure 201 after the fabrication thereof from the radiation-sensitive material 203. A backside of the substrate 214 typically disposed on the stationary base plate 216 during fabrication of the radiation-cured structure 201 may also have a coating to militate against an undesired contamination of the substrate 214. The stationary base plate 216 may include a porous vacuum chuck having a pressure-facilitated release, for example, for selectively holding the substrate 214 in place during the fabrication process. A skilled artisan may select suitable surface treatments, including coatings, as desired.

Alternatively, it should be appreciated that the radiation-sensitive material 203 may be provided as a free standing film with no substrate 214 in lieu of the step of providing the processing substrate 214 as described hereinabove.

The radiation-sensitive material 203 includes at least one of a radiation-curable material and a radiation-dissociable material. The term "radiation-curable material" is defined herein as any material that is at least one of initiated, polymerized, and crosslinked by exposure to radiation. It should be appreciated that an increase in temperature may also be employed to at least partially complete polymerization or crosslinking of the radiation-curable materials following an initiation by the exposure to radiation. The term "radiation-dissociable material" is defined herein as any material that exhibits at least one of a scissioning of the polymer backbone and a decrosslinking by exposure to radiation. As a nonlimiting example, the radiation-dissociable material may be made solvent-soluble by a sufficient breakage of crosslinks and/or scissioning of the polymer backbone of the radiation-dissociable material.

As nonlimiting examples, the radiation-curable materials may include one of a liquid photomonomer and a substantially solid radiation-curable polymer. The radiation-sensitive material 203 may be a liquid photomonomer as described by Jacobsen in U.S. Pat. No. 7,382,959 and U.S. application Ser. No. 11/801,908. Nonlimiting examples of suitable photomonomers include monomers that polymerize via free-radical polymerization when exposed to UV radiation (wavelength between about 250 nm and about 400 nm). The photomonomer may include any suitable free-radical photomonomer material such as urethanes (polyurethanes), acrylates, methacrylates, and cationic polymers such as photocured epoxies. Suitable liquid photomonomers may exhibit a shift in index of refraction upon photopolymerization, for example, to provide self-propagating waveguides. Other photomonomers may also be employed, as desired.

Suitable substantially solid radiation-curable polymers may include negative resist polymers. Negative resist polymers go through a photoinitiation process that leads to a curing of the negative resist polymer by polymerization or polycondensation, for example. Where the polymerization or polycondensation reaction occurs at substantially the same time, the process is referred to as "photocured". Where only the reaction species are generated by the photoinitiation process and a subsequent step such a heating is required to generate the polymerization or polycondensation, the process is be referred to as "photoinitiated". It should be appreciated that even though a post-cure heat treatment may be necessary to finalize the polymerization step, substantially stable radiation-cured features in the negative photoresist polymer may also be created during the initial radiation exposure. The substantially solid radiation-curable polymers can go through just the initiation process and, due to inherent stability and the limited diffusion rate of the chemical species within the solid radiation-curable polymers, the curing process may also be performed much later without significant feature degradation. It should be appreciated that most photoinitiated polymers begin the curing process at the inception of the initiation process, but the kinetics of the reaction at the exposure temperature are so slow that little, if any, polymerization or polycondensation may take place prior to heating the negative resist polymer to a desired curing temperature.

One particular negative resist polymer is the epoxy-based SU-8 2000™ negative resist polymer, commercially available from Microchem Corporation in Newton, Mass. The SU-8 2000™ negative resist polymer is curable by UV radiation. It should be appreciated that other substantially solid radiation-curable polymers may be employed. For example, similar to the photomonomers described above, the radiation-curable polymer selected may be cured with radiation of wavelengths other than UV radiation, as desired. The radiation-curable polymer may also be selected to have a slower cure rate than the liquid photomonomer, for example, to militate against features from appearing in the slower curing layer with exposure of the faster curing layer to a radiation source.

As a nonlimiting example, the radiation-dissociable materials may include positive resist polymers. Positive resist polymers begin as crosslinked polymers but may contain photoinitiators that, when exposed to a particular radiation, generate chemical species which dissociate the polymer by at least one of breaking the crosslinks and scissioning the polymer backbone. The dissociation makes the positive resist polymer soluble in the regions which have been exposed to the radiation. Regions where the positive resist polymer remains cured are masked rather than being exposed, as is the case with the negative resist polymers described hereinabove. In certain embodiments, the positive resist polymers are sensitive to radiation, e.g., ultraviolet radiation, without the need for photoinitiators. For example, the positive resist polymer may itself be damaged by the radiation and the remaining scissioned chains become soluble in a solvent. Other types of positive resist polymers may be employed, as desired.

The mask material 206 forming the mask 204 is a substantially radiation transparent material, such as quartz glass, for example. The apertures 212 may be holes or substantially radiation transparent apertures formed in an otherwise opaque, radiation-blocking coating disposed on the quartz glass, for example. In one illustrative embodiment, the mask 204 has a plurality of apertures 212. As further nonlimiting examples, the mask material 206 may include one of crown glass, Pyrex glass, and a polyethylene terephthalate, such as a Mylar® film. The mask 204 may be lifted away after an exposure and cleaned for reuse. The apertures 212 may have shapes that provide the radiation beams 210, and thereby radiation-cured elements 202, with desired cross-sectional shapes. For example, the apertures 212 may be substantially circular to result in formation of radiation-cured elements 202 with elliptical cross-sectional shapes. A skilled artisan may select suitable mask materials, aperture sizes and shapes, and resulting structural configurations, as desired.

The radiation source 208 generates electromagnetic radiation. The radiation beams 210 employed to cure the radiation-sensitive material 203 may be generated by a Mercury arc lamp providing ultraviolet (UV) radiation beams 210, for example. A skilled artisan understands that radiation beams 210 of other wavelengths, such as infrared, visible light, and X-ray radiation, and from other sources, such as incandescent lights and lasers, may also be employed. It should be further understood that the radiation beams 210 may be collimated, partially collimated, or non-collimated, as desired. It should be further understood that the radiation source 208 for the present system 200 may provide substantially monochromatic radiation beams 210 that will remain collimated after passing through normalizing surfaces such as prisms or faceted masks (shown in FIGS. 2, 4, and 6 to 9).

Figure 2:
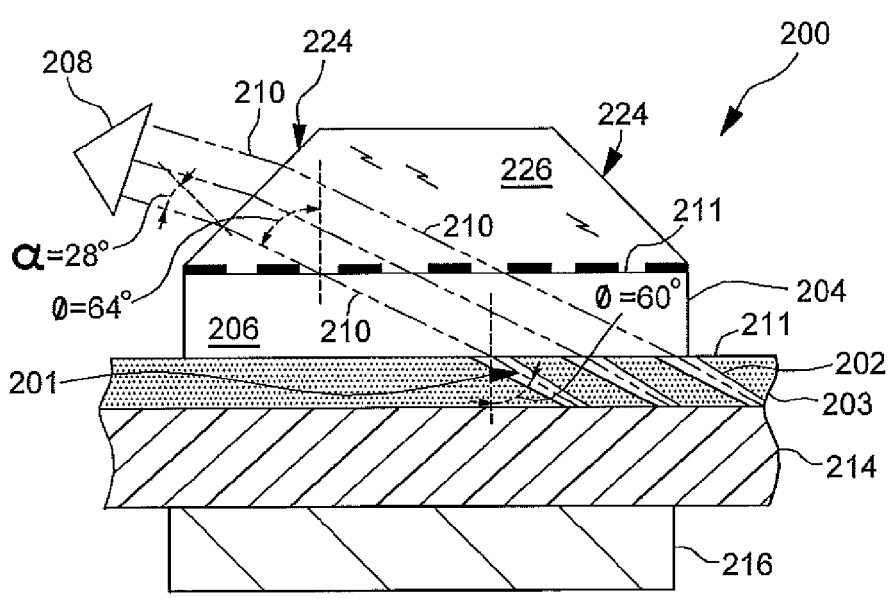
FIG. 2 is a schematic side sectional view of a system according to a further embodiment of the present disclosure, showing a prism disposed adjacent a mask.

With reference to FIG. 2, the system 200 may include an at least one normalizing surface 224 disposed between the radiation source 208 and the mask 204. The normalizing surface 224 is configured to allow the radiation beams 210 from the radiation source 208 to intersect the normalizing surface 224 substantially at normal relative to a plane defined by the normalizing surface 224. The normalizing surface 224 may be configured to allow the radiation beams 210 to intersect the normalizing surface 224 at an angle relative to normal that is less than an angle that the radiation beams 210 would intersect a surface of the mask 204 absent the normalizing surface 224. As shown in FIG. 2, the at least one normalizing surface 224 may be provided by a prism 226. Illustratively, the prism 226 is formed from a substantially radiation transparent material, such as quartz glass. The prism 226 may be a prism having a geometrical triangular or rectangular pyramid shape, although optical prisms of other shapes may also be employed. The rectangular pyramid shape may be particularly advantageous due to the ease of manufacture. Other suitable radiation transparent materials may also be employed. It should be appreciated that the mask 204 may be integrally formed with the prism 226 to militate against pockets of air forming therebetween.

In a particular embodiment, the prism 226 may include four normalizing surfaces 224 configured to allow the radiation beams 210 to intersect the normalizing surfaces 224 at an angle substantially perpendicular thereto. It should be appreciated that any number of normalizing surfaces 224 may be employed, as desired. Refraction of the radiation beams 210 at the refractive boundary 211 between the radiation source 208 and the mask material 206, and in particular between the air and the mask material 206, may thereby be minimized.

Figure 3:
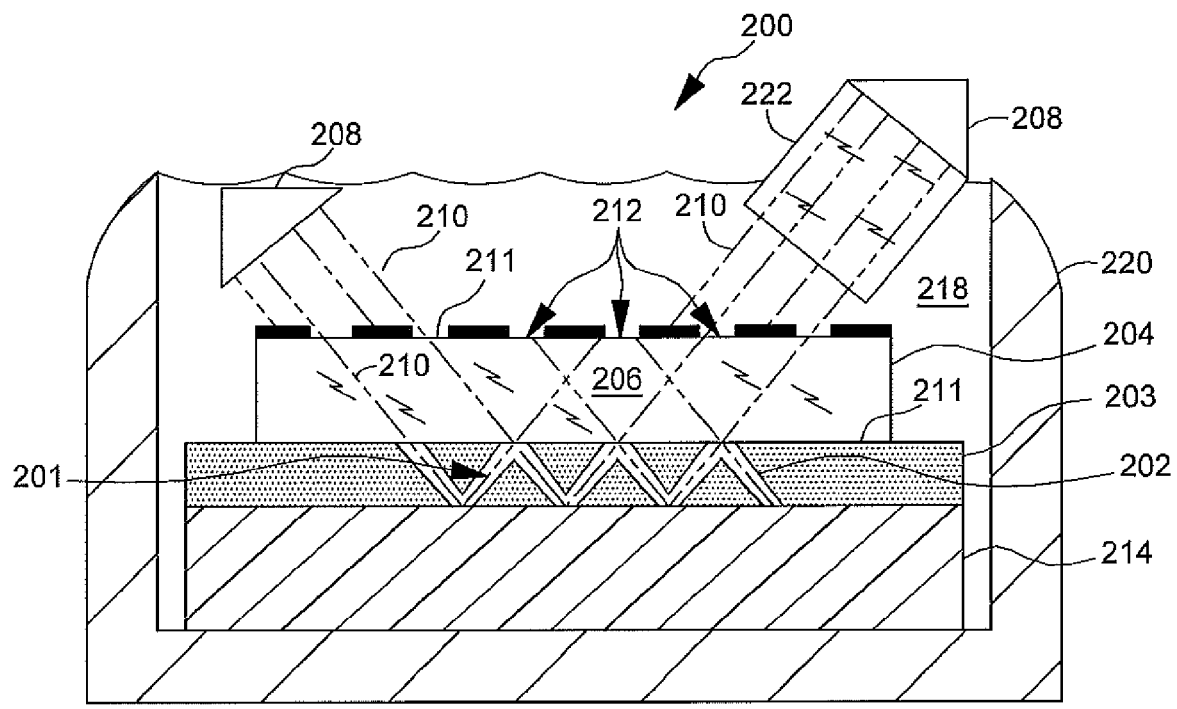
FIG. 3 is a schematic side sectional view of a system according to another embodiment of the present disclosure, showing a mask and a radiation-sensitive material immersed in a reservoir of a refractive fluid.

As shown in FIG. 3, the system 200 of the present disclosure may include a refractive fluid 218. The refractive fluid 218 has a third refractive index. The third refractive index may be selected to minimize a change in refractive index at the refractive boundary 211, for example, between the air and the mask 204 or between the mask 204 and the radiation-sensitive material 203. Desirably, the third refractive index may minimize a difference between the angle of incidence ($\alpha$) and the refracted angle ($\theta$) of the radiation beams 210 as they cross the refractive boundary 211. In a particular embodiment, the third refractive index is selected to minimize the critical angle ($\theta_c$) and facilitate the fabrication of radiation-cured elements 202 with desirably large-angled features with respect to normal.

As nonlimiting examples, the third refractive index (refractive fluid 218) may be at least one of intermediate the first refractive index (radiation-sensitive material 203) and the second refractive index (mask 204), substantially the same as the first refractive index, and intermediate the refractive index of air and the second refractive index. For desirable tolerance control, the third refractive index may particularly be substantially the same as the first refractive index when the radiation-sensitive material 203 is drawn against a vacuum chuck. The refractive fluid 218 may be selected from any substantially radiation transparent fluid having the desired third refractive index. The refractive fluid 218 also is selected to not significantly dissolve or degrade the radiation-sensitive material 203 and the mask 204 during the fabrication of the radiation-cured structure 201. For example, the refractive fluid 218 may include one of water, an aqueous sugar solution, acetone, and mineral oil. One of ordinary skill in the art may select other suitable refractive fluids 218, as desired.

In one embodiment, the refractive fluid 218 may be disposed between the mask 204 and the radiation source 208. As illustratively shown in FIG. 3, the refractive fluid 218 may be disposed between the mask 204 and the radiation source 208 by at least partially immersing the mask 204 and the radiation source 208 in a reservoir 220 of the refractive fluid 218. It has been recognized that the thin layer of air disposed at the refractive boundary 211 between the mask 204 and the radiation-sensitive material 203 may also be sufficient to limit the critical angle ($\theta c$), and thus limit the angles of features in the resulting radiation-cured structure 201. The refractive fluid 218 desirably replaces any residual air that would otherwise be present between the radiation-sensitive material 203 and the mask 204.

Where the system 200 has the refractive fluid 218 disposed between the mask 204 and the radiation source 208, it should be appreciated that the refractive fluid 218 may desirably be selected to have the third index of refraction similar to the second refractive index. In particular, the refractive fluid 218 may be selected to have the third index of refraction substantially the same as the second index of refraction. Refraction of the radiation beams 210 at the refractive boundaries 211 between the radiation source 208 and the mask material 206, and between the mask material 206 and the radiation-sensitive material 203, may thereby be minimized.

To militate against potential heat transfer problems associated with having the radiation source 208 immersed in the refractive fluid 218, the radiation source 208 may be coupled with a lens 222. The lens 222 has a thickness sufficient for the lens 222 to be at least partially immersed in the refractive fluid 218 and for the bulk of the radiation source 208 to remain dry above the reservoir 220. The lens 222 may have parallel sides substantially normal to the radiation beams 210 and is at least partially immersed in the reservoir 220 of the refractive fluid 218. Illustratively, the lens 222 is formed from a substantially radiation transparent material, such as quartz glass. Other suitable radiation transparent materials may also be employed. The lens 222 may have a refractive index that is substantially the same as the third refractive index of the refractive fluid 218. It should be appreciated that any refractive index of the lens 222 may be acceptable if the incident angle ($\alpha$) is approximately zero. If the lens 222 were to be slightly rotated, for example, intentionally or by tolerance, it should be further appreciated that there is a slight benefit from matching indices of refraction. The lens 222 may thereby militate against refraction of the radiation beams 210 at the refractive boundary 211 between the lens 222 and the refractive fluid 218. The lens 222 may further be configured to allow the radiation beams 210 to pass through the refractive boundary 211 formed by the refractive fluid 218 and the lens 222 at an angle substantially normal relative to the boundary.

Figure 4:
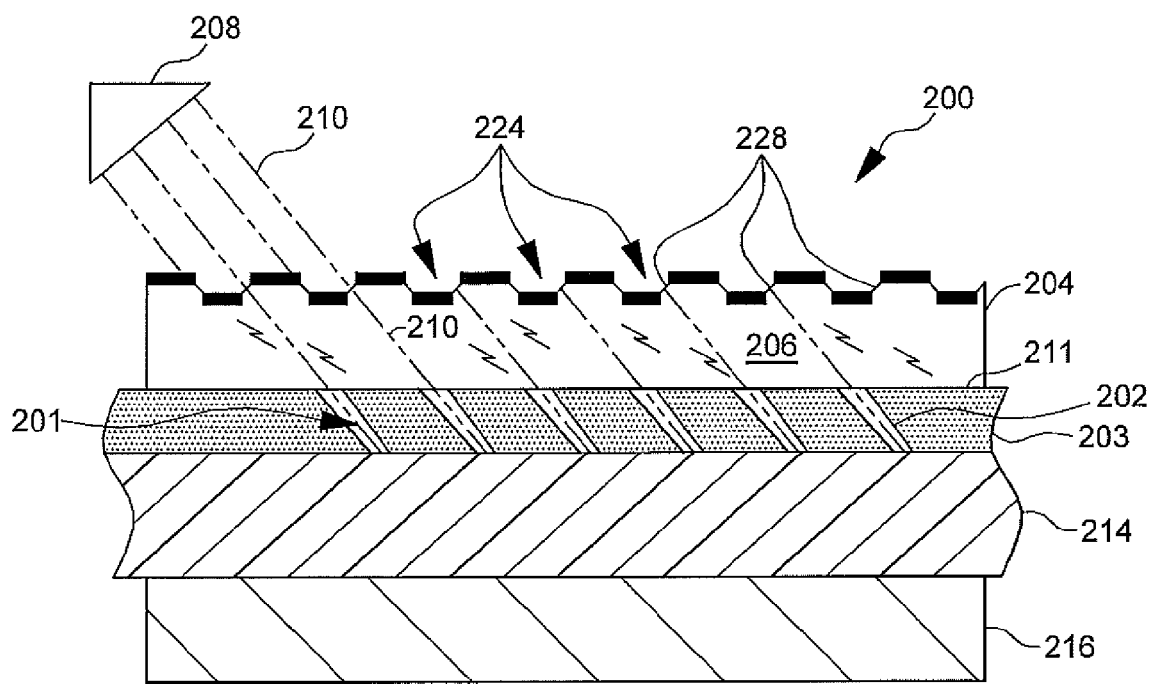
FIG. 4 is a schematic side sectional view of a system having a faceted mask disposed adjacent a radiation-sensitive material.

In a further embodiment shown in FIG. 4, the mask 204 has a plurality of facets 228 formed therein that provide the normalizing surfaces 224. The mask 204 may be formed in separate sections, for example, in the shape of a Fresnel lens to provide the plurality of facets 228. The plurality of facets 228 may be molded or cut into the surface of the mask 204. The relative angles of the facets 228 may be the same or different across the surface of the mask 204, and may be selected as desired. In particular, the facets 228 are configured to minimize the bending of the radiation beams 210 at the refractive boundary 211 between the radiation source 208 and the mask material 206, and in particular between the air and the facets 228.

Figure 5:
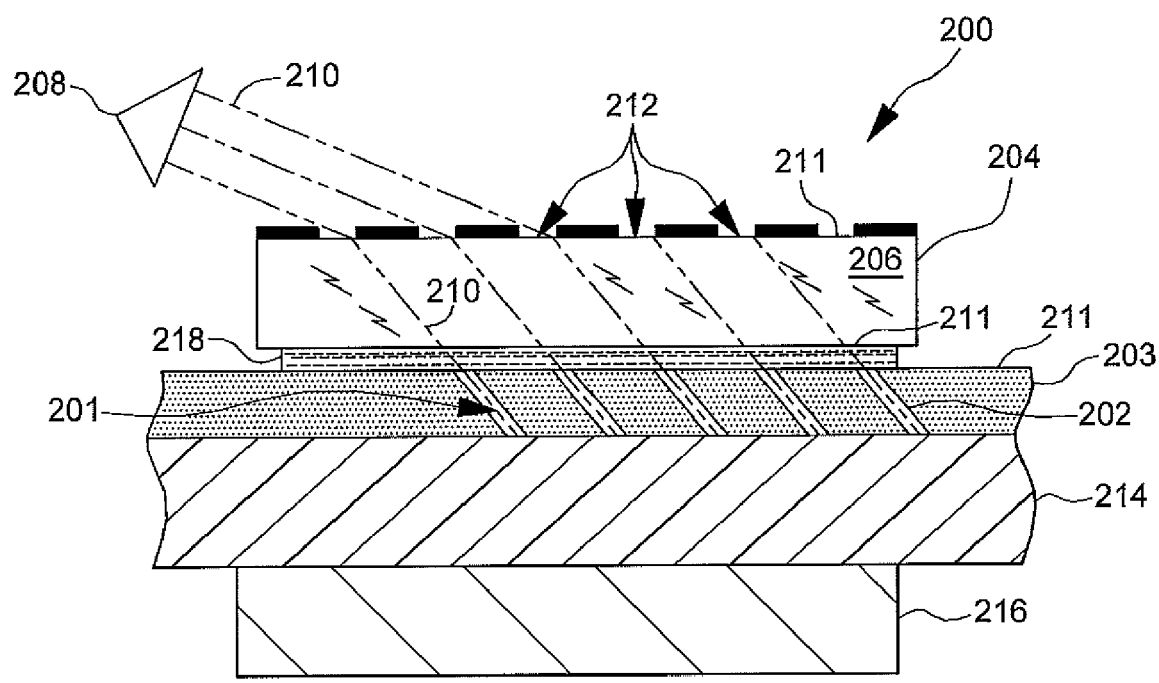
FIG. 5 is a schematic side sectional view of a system having an intervening refractive fluid between a mask and a radiation-sensitive material.

Referring to FIG. 5, the refractive fluid 218 may be disposed in the form of a layer between the mask 204 and the radiation-sensitive material 203. The refractive fluid 218 may be applied to the radiation-sensitive material 203 before placing the mask 204 on top of the radiation-sensitive material 203, for example. As a nonlimiting example, where the system 200 includes the refractive fluid 218 disposed between the radiation-sensitive material 203 and the mask 204, it should be appreciated that the refractive fluid 218 may be selected to have the third refractive index between the first refractive index of radiation-sensitive material 203 and the second refractive index of the mask material 206. It should be further appreciated that the third refractive index may desirably be substantially the same as the first refractive index. In particular embodiments, the refractive fluid 218 may be selected to have the third refractive index greater than, or less than, each of the first and second refractive indices, as desired. A refraction of the radiation beams 210 at the refractive boundary 211 of the radiation-sensitive material 203 and the mask material 206 may thereby be minimized, and a desired angle of the truss element 202 thereby produced.

Figure 6:
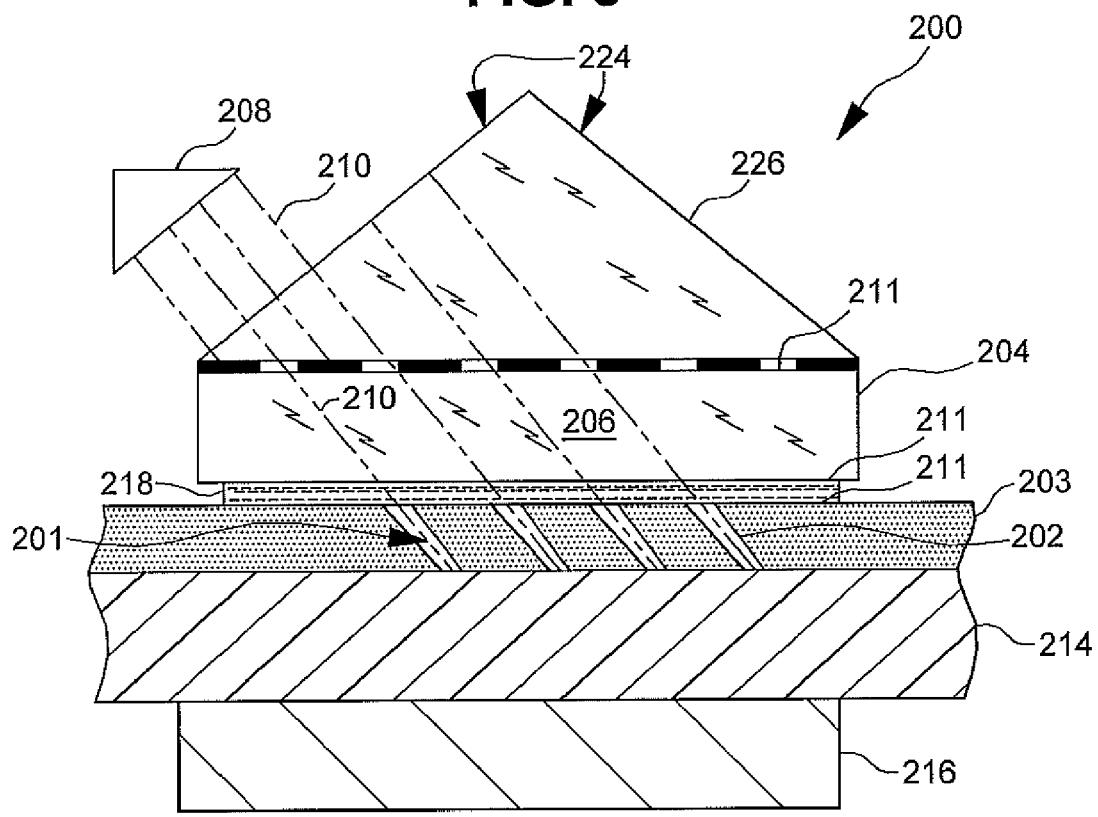
FIG. 6 is a schematic side sectional view of an alternative system according to the present disclosure, having the prism as shown in FIG. 2 and the intervening refractive fluid as shown in FIG. 5.
Figure 7:
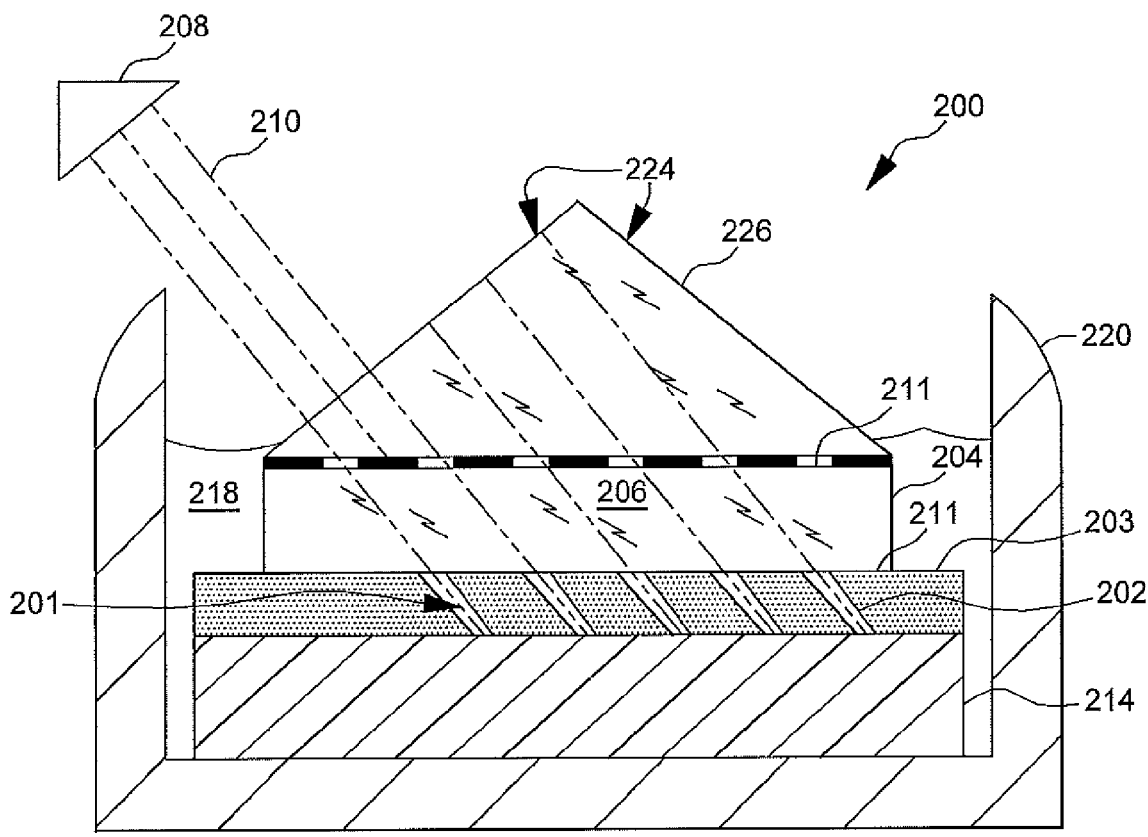
FIG. 7 is a schematic side sectional view of a system having the prism of FIG. 2 and a reservoir of the refractive fluid as shown in FIG. 3.
Figure 8:
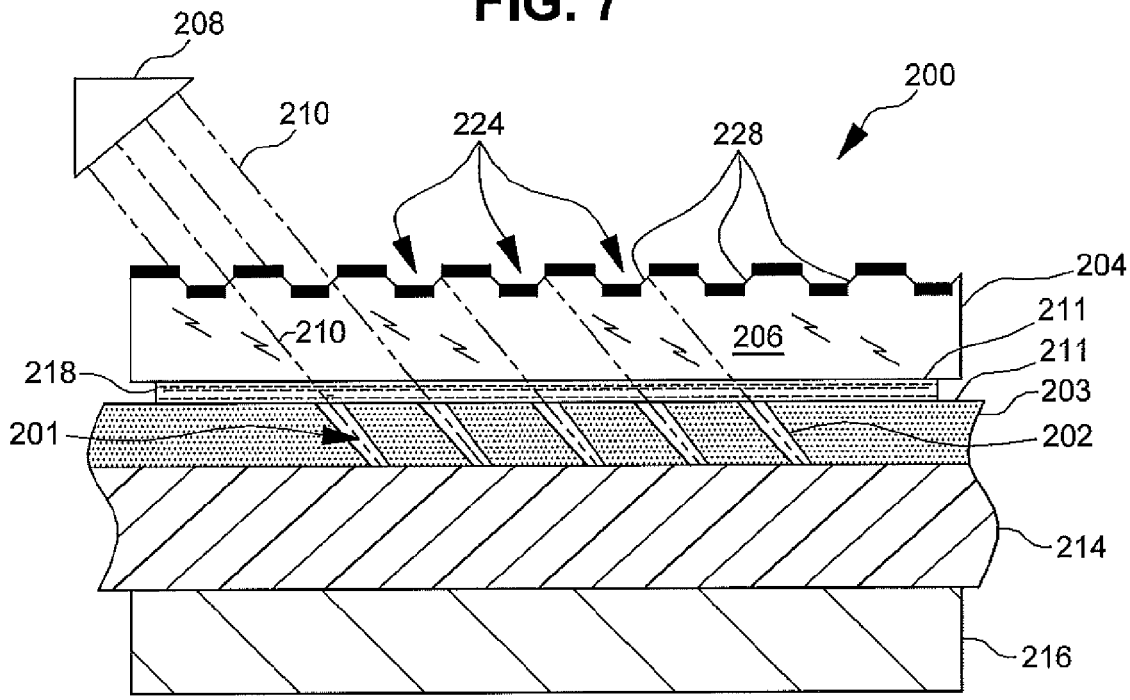
FIG. 8 is a schematic illustration of a system having the faceted mask as shown in FIG. 4 and the intervening refractive fluid as shown in FIG. 5.

As shown in FIGS. 6-8, the system 200 having the normalizing surface 224 may be used in conjunction with the refractive fluid 218 to minimize refraction of the radiation beams 210 throughout the system 200, and to maximize the critical angle ($\theta_c$) at the refractive boundaries 211. With particular reference to FIG. 6, the system 200 may include the prism 226 disposed atop the mask 204 and the layer of refractive fluid 218 disposed between the mask 204 and the radiation-sensitive material 203. As further shown in FIG. 7, the system 200 may include the prism 226, the radiation-sensitive material 203, and the mask 204 at least partially immersed in the reservoir 220 of the refractive fluid 218. Desirably, the refractive fluid 218 between the prism 226 and the mask 204 militates against the presence of an air filled gap therebetween, which would otherwise provide the refractive boundary 211 with an undesirable critical angle ($\theta_c$). As also shown in FIG. 8, the system 200 may include the mask 204 with the plurality of facets 228 and the layer of refractive fluid 218 disposed between the mask 204 and the radiation-sensitive material 203.

The present disclosure includes a method for fabricating the radiation-cured structure 201. The method first includes the step of providing the radiation-sensitive material 203 having a first refractive index, the mask 204 formed from the mask material 206 having the second refractive index, and the radiation source 208 configured to generate the radiation beams 210 for at least one of initiating, polymerizing, crosslinking, and dissociating the radiation-sensitive material 203. The mask 204 has the plurality of radiation transparent apertures 212 and is placed between the radiation-sensitive material 203 and the radiation source 208.

The method of the present disclosure employs steps that militate against dispersive refraction and total internal reflection of the radiation beams 210 at the various refractive boundaries 211 within the system 200. For example, the method includes at least one of the steps of a) disposing the at least one normalizing surface 224 between the radiation source 208 and the mask 204, b) disposing the refractive fluid 218 between the radiation source 208 and the mask 204, and c) disposing the refractive fluid 218 between the mask 204 and the radiation-sensitive material 203. The step of disposing the refractive fluid 218 between the radiation source 208 and the mask 204 may include the step of at least partially immersing at least one of the radiation source 208, the mask 204, and the radiation-sensitive material 203 in the reservoir 220 of the refractive fluid 218. In another embodiment, the step of disposing the refracting fluid 218 between the mask 204 and the radiation-sensitive material 203 may include the step of applying the layer of the refractive fluid 218 to the radiation-sensitive material 203 prior to placing the mask 204 adjacent thereto. In a further embodiment, the step of disposing the at least one normalizing surface 224 between the radiation source 208 and the mask 204 may include the step of placing the prism 226 atop the mask 204. Alternatively, the step of disposing the at least one normalizing surface 224 between the radiation source 208 and the mask 204 may include the step of providing the mask 204 with the surface having the plurality of facets 228. In another embodiment, the step of disposing the refractive fluid 218 between the radiation source 208 and the mask 204 includes the further step of disposing the refractive fluid 218 between the mask 204 and the prism 226. One of ordinary skill in the art should appreciate that the various steps described for militating against dispersive refraction and total internal reflection of the radiation beams 210 within the system 200 may be employed individually, or in combination, within the scope of the present disclosure.

The radiation-sensitive material 203 is subsequently exposed to the plurality of radiation beams 210 through the radiation transparent apertures 212 in the mask 204. The radiation-cured structure 201 having the radiation-cured elements 202 is thereby formed. It should be appreciated that a variety of the radiation-cured elements 202 may be formed according to the present method, including truss elements, radiation-cured sheets, and solid radiation-cured polymer structures.

The refractive fluid 218 may be selected to have the desired third refractive index, for example, to closely match the refractive indices of adjacent media such as the radiation-sensitive material 203 and the mask material 206. As nonlimiting examples, the radiation-sensitive material 203 and the refractive fluids 218 may be selected based on the respective refractive indices shown in Table 1 below.

TABLE 1

| MEDIA | INDEX OF REFRACTION |
| --- | --- |
| AIR | 1.000 |
| WATER | 1.333 |
| ACETONE | 1.360 |
| FUSED SILICA | 1.458 |
| FUSED QUARTZ | 1.460 |
| CARBON TET CL | 1.461 |
| PYREX GLASS | 1.470 |
| SUGAR IN WATER, 80% | 1.490 |
| SUGAR IN WATER, 85% | 1.503 |
| LIQUID PHOTOMONOMER | 1.510 |
| CROWN GLASS | 1.520 |
| SOLID PHOTOMONOMER | 1.556 |
| PET | 1.575 |
| SU-8 PHOTORESIST | 1.590 |

In certain embodiments, the refractive fluid 218 is selected to have the third refractive index intermediate the first refractive index of the radiation curable material 203 and air. For example, where the radiation-sensitive material 203 is SU-8 photoresist (having an index of refraction of about 1.590) and the mask material 206 is fused quartz (having an index of refraction of about 1.460), an eighty percent (80%) sugar water solution (having an index of refraction of about 1.490) may be selected for placement as the refractive fluid 218 between the radiation curable materials 203 and the mask material 206. The sugar water solution displaces any air that may otherwise be disposed between the radiation curable materials 203 and the mask material 206.

The refractive fluid 218 may be selected to have the third refractive index substantially the same as the first refractive index. For example, where the radiation-sensitive material 203 is a liquid photomonomer (having an index of refraction of 1.510), an eighty-five percent (85%) sugar water solution (having an index of refraction of about 1.503) may be selected for placement adjacent the radiation-sensitive material 203.

The refractive fluid 218 may also be selected to have the third refractive index between the refractive index of air and the second refractive index. For example, where the mask material 206 is crown glass (having an index of refraction of about 1.520), water (having an index of refraction of about 1.333) may be selected for placement between the spaced apart radiation source 208 and the mask 204. In particular, the radiation source 208 may be at least partially immersed in the water to minimize refraction of the radiation beams 210 generated by the radiation source 208.

The present method may further include the step of selecting the angle of the normalizing surface 224 to allow the radiation beams 210 to contact the normalizing surface 224 at an angle substantially perpendicular to the normalizing surface 224. The method may also include the step of selecting the angle of the normalizing surface 224 to allow the radiation beams 210 to contact the normalizing surface 224 at an angle with respect to normal that is less than an angle the radiation beams 210 would otherwise contact absent the normalizing surface 224. The refraction of the radiation beams 210 as they pass through the normalizing surface 224, and the difference between the angle of incidence ($\alpha$) and the refracted angle ($\theta$) of the radiation-cured element 202, may thereby be minimized.

EXAMPLE

The following example is merely illustrative and does not in any way limit the scope of the disclosure as described and claimed.

The radiation-cured structure 201 with at least one radiation-cured element 202 having an angle of about seventy degrees (70°) relative to normal to the plane of the refractive boundary 211 is fabricated according to the present example. To militate against dispersive prism effects which can appear at each refractive boundary 211, even on parallel faced bodies, the indices of refraction between different media are matched as closely as possible, and where a difference in index of refraction is unavoidable, the radiation beams 210 are caused to cross the refractive boundary 211 at an angle about normal to the refractive boundary 211.

The radiation-sensitive material 203 is SU-8 negative photoresist. The SU-8 negative photoresist has a mask 204 formed from crown glass that is disposed thereon. A layer of refractive fluid 218 consisting of a sugar water solution is disposed between the SU-8 and the crown glass mask 204 and prism 226. The radiation source 208 is spaced apart from the mask 204. Three distinct refractive boundaries 211 are formed at the interfaces of the various media, having different indices of refraction as shown in Table 2 below.

TABLE 2

| MEDIA | INDEX OF REFRACTION | ANGLE WRT NORMAL |
|---|---|---|
| SU-8 | 1.590 | 70.0 |
| SUGAR IN WATER, 85% | 1.503 | 83.8 |
| CROWN GLASS | 1.520 | 79.4 |
| AIR | 1.000 | 0.0 |

Figure 9:
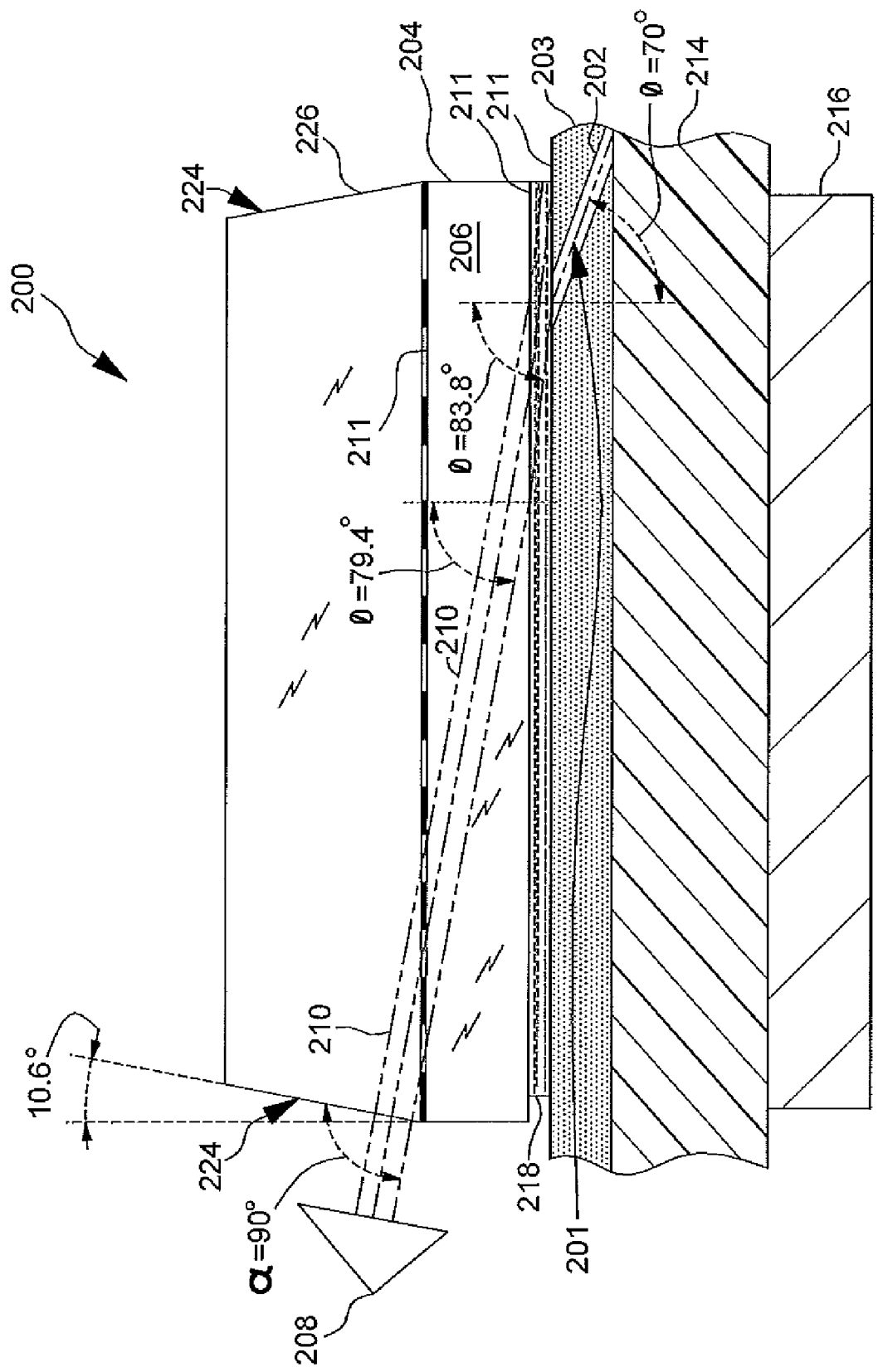
FIG. 9 is a schematic illustration of a system as described in an exemplary embodiment according to the present disclosure.

As shown in Table 2 and in FIG. 9, a prism 226 having a normalizing surface 214, for example, at an angle of about 10.6 degrees relative to the refractive boundary 211 is employed. Radiation beams 210 traveling through the air from the radiation source 208 intersect the refractive boundary 211 formed by the air and the crown glass at the angle of incidence ($\alpha$) of about 0° relative to normal. The refracted angle ($\theta$) of the radiation beams 210 after crossing the refractive boundary 211 into the crown glass remain at about 0° relative to normal to the refractive boundary 211. A prism 226 having a normalizing surface 224, for example, at an angle of about 10.6 degrees relative to the refractive boundaries 211 is employed to provide the angle of incidence ($\alpha$) of about 73.8° relative to normal to the refractive boundary 211. As the radiation beams 210 travel through the prism 226 to the mask 204, the refracted angle ($\theta$) is about 79.4° relative to normal to the refractive boundary 211 at the crown glass to sugar water interface.

The sugar water solution displaces any air that might otherwise be disposed between the crown glass and the SU-8 negative photoresist. Since the indices of refraction of the crown glass and the sugar water solution are similar, the refracted angle ($\theta$) is about 83.8° relative to normal to the refractive boundary 211 after the radiation beams 210 cross into the sugar water solution. Upon the crossing of the radiation beams 210 into the SU-8 negative photoresist, it is expected that the refracted angle ($\theta$), and thereby the angle of the radiation-cured element 202, is about 70° relative to normal to the refractive boundary 211. The formation of large-angled radiation beams 210 and related radiation-cured elements 202 having angles greater than about 45°, and particularly greater than about 60°, relative to normal to the refractive boundary 211 is thereby facilitated.

It is surprisingly found that, in addition to the facilitating the fabrication of the radiation-cured structures 201 with large-angled features, the approach of the present disclosure facilitates the production of structures at angles that were marginally feasible with previously known methodology. It should be appreciated that, because the critical angle ($\theta_c$) is derived from the indices of refraction for the initial and final optical media such as air and the radiation-sensitive material 203 or the mask material 206, the critical angle ($\theta_c$) limitation can be militated against by substituting the refractive fluid 218 for the air. The system 200 and method is designed such that the indices of refraction between the refractive boundaries 211, such as between the radiation-sensitive material 203, and the mask material 206, may be minimized. The system 200 is also designed such that the radiation beams 210 pass through the refractive boundaries 211 of the system 200 at angles desirably close to normal, thereby further minimizing dispersive refraction and sensitivity to changes in the indices (such as due to changes in temperature, pressure, and RH of the air, for example), the radiation beams 210, and the related critical angle ($\theta_c$). TIR conditions are thereby mitigated.

While certain representative embodiments and details have been shown for purposes of illustrating the invention, it will be apparent to those skilled in the art that various changes may be made without departing from the scope of the disclosure, which is further described in the following appended claims.

What is claimed is:

1. A method for fabricating a radiation-cured structure, the method comprising the steps of:
    providing a radiation-sensitive material having a first refractive index, a mask having a plurality of substantially radiation transparent apertures, the mask formed from a material having a second refractive index, and a radiation source configured to generate radiation beams for at least one of initiating, polymerizing and crosslinking the radiation-sensitive material;
    placing the mask between the radiation-sensitive material and the radiation source, the mask abutting the radiation-sensitive material;
    disposing a refractive fluid having a third refractive index between the radiation source and the mask, wherein the refractive fluid is selected to have one of the third refractive index intermediate the first refractive index and the second refractive index, the third refractive index substantially the same as the first refractive index, and the third refractive index between the refractive index of air and the second refractive index; and
    exposing the radiation-sensitive materials to a plurality of radiation beams through the radiation transparent apertures in the mask, whereby the radiation-cured structure is formed.

2. The method of claim 1, wherein the step of disposing the refractive fluid between the radiation source and the mask includes the step of at least partially immersing the radiation source, the mask, and the radiation-sensitive material in the refractive fluid.

3. A method for fabricating a radiation-cured structure, the method comprising the steps of:
providing a radiation-sensitive material having a first refractive index, a mask having a plurality of substantially radiation transparent apertures, the mask formed from a material having a second refractive index, and a radiation source configured to generate radiation beams for at least one of initiating, polymerizing and crosslinking the radiation-sensitive material, a prism integral with the mask and not having air disposed therebetween;
placing the mask between the radiation-sensitive material and the radiation source, an at least one normalizing surface disposed between the radiation source and the radiation-sensitive material, the at least one normalizing surface provided by the prism of the mask, and
exposing the radiation-sensitive materials to a plurality of radiation beams through the radiation transparent apertures in the mask, whereby the radiation-cured structure is formed.

4. The method of claim 3, further comprising the step of selecting the angle of the normalizing surface to allow the radiation beams to contact the normalizing surface at about normal to the normalizing surface, thereby minimizing a refraction of the radiation beams as they pass through the normalizing surface.

5. A method for fabricating a radiation-cured structure, the method comprising the steps of:
providing a radiation-sensitive material having a first refractive index, a mask having a plurality of substantially radiation transparent apertures, the mask formed from a material having a second refractive index, and a radiation source configured to generate radiation beams for at least one of initiating, polymerizing and crosslinking the radiation-sensitive material;
placing the mask between the radiation-sensitive material and the radiation source, the mask having a faceted surface with a plurality of facets providing a plurality of normalizing surfaces, the plurality of facets minimizing a bending of the radiation beams at a refractive boundary between the radiation source and the mask; and
exposing the radiation-sensitive materials to a plurality of radiation beams through the radiation-transparent apertures in the mask, whereby the radiation-cured structure is formed.

6. The method of claim 5, further comprising the step of selecting the angle of the normalizing surfaces to allow the radiation beams to contact the normalizing surfaces at about normal to the normalizing surfaces, thereby minimizing a refraction of the radiation beams as they pass through the normalizing surfaces.

* * * * *

UNITED STATES PATENT AND TRADEMARK OFFICE
CERTIFICATE OF CORRECTION

PATENT NO. : 8,367,307 B2  
APPLICATION NO. : 12/700800  
DATED : February 5, 2013  
INVENTOR(S) : Jeffrey A. Rock, Alan Jacobsen and William Carter Page 1 of 1

It is certified that error appears in the above-identified patent and that said Letters Patent is hereby corrected as shown below:

TITLE PAGE:
Please add the names listed in (75) Inventors as Alan Jacobsen, Woodland Hills, CA; and William Carter, Calabasas, CA.

Signed and Sealed this
Seventeenth Day of March, 2015

Michelle K. Lee
*Director of the United States Patent and Trademark Office*